United States Patent
Ma et al.

(10) Patent No.: US 11,201,312 B2
(45) Date of Patent: Dec. 14, 2021

(54) ORGANIC LIGHT-EMITTING DISPLAY PANEL AND ENCAPSULATION FILM EACH HAVING AUXILIARY ENCAPSULATION LAYER DOPED WITH WATER ABSORBING MATERIAL AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventors: Kai Ma, Wuhan (CN); Gaozhen Wang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 143 days.

(21) Appl. No.: 16/623,519

(22) PCT Filed: Aug. 8, 2019

(86) PCT No.: PCT/CN2019/099749
§ 371 (c)(1),
(2) Date: Dec. 17, 2019

(87) PCT Pub. No.: WO2020/252865
PCT Pub. Date: Dec. 24, 2020

(65) Prior Publication Data
US 2021/0280824 A1  Sep. 9, 2021

(30) Foreign Application Priority Data
Jun. 17, 2019 (CN) .......................... 201910521393.3

(51) Int. Cl.
*H01L 51/52* (2006.01)
*H01L 51/00* (2006.01)
*H01L 51/56* (2006.01)

(52) U.S. Cl.
CPC ...... *H01L 51/5253* (2013.01); *H01L 51/0097* (2013.01); *H01L 51/5259* (2013.01); *H01L 51/56* (2013.01); *H01L 2251/5338* (2013.01)

(58) Field of Classification Search
CPC .................... H01L 51/5253; H01L 51/5256
See application file for complete search history.

(56) References Cited

U.S. PATENT DOCUMENTS

2006/0006798 A1* 1/2006 Buckley ................. H05B 33/04
  313/512
2009/0267487 A1* 10/2009 Kwack ................ H01L 51/5256
  313/503
(Continued)

FOREIGN PATENT DOCUMENTS

CN  105374946 A  3/2016
CN  106711176 A  5/2017
(Continued)

*Primary Examiner* — Michael Jung
(74) *Attorney, Agent, or Firm* — Osha Bergman Watanabe & Burton LLP

(57) ABSTRACT

The present invention discloses an organic light-emitting display panel, a manufacturing method thereof, and an encapsulation film thereof. In this invention, an auxiliary encapsulation layer is disposed on an outer side of an inorganic layer, and the auxiliary encapsulation layer at least covers a bending region of the inorganic layer and a boundary region of the inorganic layer. Even if the inorganic layer cracks or peels in the bending region and the boundary region, a channel of water and oxygen generated at a cracked place or a peeling place is blocked by the auxiliary encap-
(Continued)

sulation layer, thereby ensuring an ability of the encapsulation film to block water and oxygen into an organic light-emitting device.

6 Claims, 2 Drawing Sheets

(56) References Cited

U.S. PATENT DOCUMENTS

| | | | |
|---|---|---|---|
| 2014/0070195 A1* | 3/2014 | Choi | H01L 51/5256 257/40 |
| 2015/0054143 A1 | 2/2015 | Chuang et al. | |
| 2016/0064691 A1* | 3/2016 | Lee | H01L 51/5275 257/40 |
| 2016/0276624 A1* | 9/2016 | Wang | H01L 51/5253 |
| 2016/0322604 A1* | 11/2016 | Ho | H01L 27/3262 |
| 2016/0380235 A1* | 12/2016 | Kim | H01L 51/5262 257/40 |
| 2018/0151835 A1* | 5/2018 | Kim | H01L 51/5253 |
| 2018/0301512 A1 | 10/2018 | Yu | |
| 2019/0136075 A1* | 5/2019 | Lassiter | C09D 11/101 |

FOREIGN PATENT DOCUMENTS

| | | |
|---|---|---|
| CN | 106848105 A | 6/2017 |
| CN | 108198953 A | 6/2018 |
| CN | 108428807 A | 8/2018 |

* cited by examiner ional light-emitting display panel and encapsulation film each having auxiliary encapsulation layer doped with water absorbing material and manufacturing method thereof

FIELD OF INVENTION

The present invention is related to the field of organic light-emitting diode (OLED) technology, and specifically to an organic light-emitting display panel, a manufacturing method thereof, and an encapsulation film thereof.

BACKGROUND OF INVENTION

Organic light-emitting display panels have the advantages of low cost, wide viewing angles, high contrast, and flexibility, and has achieved remarkable results in small size products and large size products. It is constantly encroaching on the market share of the liquid crystal displays (LCDs).

An organic light-emitting device is an important portion of the organic light-emitting display panel, but water and oxygen have a great influence on its lifetime. First, water and oxygen easily react with the conductive material of the cathode of the organic light-emitting device. Second, water and oxygen easily react with the hole transport layer and the electron transport layer of the organic light-emitting device, thereby causing the organic light-emitting device to fail. In order to solve these problems, the organic light-emitting display panel of the prior art encapsulates the organic light-emitting device using a thin film encapsulation (TFE) method. The encapsulation film used in the TFE method includes laminated an inorganic layer and an organic layer to prevent the organic light-emitting device from the intrusion of water and oxygen.

However, the encapsulation film used in the current TFE method still has insufficient blocking properties against water and oxygen, especially when it covers a laminated structure or a step, the inorganic layer is easy to crack or peel in the bending region and the boundary region, thereby forming a channel of water and oxygen. Water molecules and oxygen molecules intrude from the channel of water and oxygen generated by the crack of the inorganic layer. Because the organic layer has no ability to block water and oxygen, water molecules and oxygen molecules will quickly pass through the organic layer and then continue to move at the interface of the organic layer and inorganic layer. Water molecules and oxygen molecules keep intruding inward through the channel of water and oxygen generated by the next inorganic layer crack until it intrudes the organic light-emitting device. It can be seen that the crack of the inorganic layer can seriously affect the ability of the encapsulation film to block water molecules and oxygen molecules.

SUMMARY OF INVENTION

When the inorganic layer of the prior art cracks or peels, it will cause a problem that the ability of the encapsulation film to block water and oxygen into the organic light-emitting device is insufficient.

The present invention provides an organic light-emitting display panel including an organic light-emitting device, an inorganic layer, and an auxiliary encapsulation layer encapsulating the organic light-emitting device. The auxiliary encapsulation layer at least covers a bending region of the inorganic layer and a boundary region of the inorganic layer.

The present invention further provides an encapsulation film comprising an inorganic layer, and an auxiliary encapsulation layer. The auxiliary encapsulation layer at least covers a bending region of the inorganic layer and a boundary region of the inorganic layer.

The present invention further provides a manufacturing method of an organic light-emitting display panel, comprising the steps of:
providing a substrate;
forming an organic light-emitting device and an inorganic layer encapsulating the organic light-emitting device on the substrate; and
forming an auxiliary encapsulation layer on an outer surface of the inorganic layer, and the auxiliary encapsulation layer at least covers a bending region of the inorganic layer and a boundary region of the inorganic layer.

In the present invention, the auxiliary encapsulation layer is disposed on the outer side of the inorganic layer, and the auxiliary encapsulation layer at least covers a bending region of the inorganic layer and a boundary region of the inorganic layer. Even if the inorganic layer cracks or peels in the bending region and the boundary region, the channel of water and oxygen generated at the cracked place or the peeling place is blocked by the auxiliary encapsulation layer, thereby ensuring the ability of the encapsulation film to block water and oxygen into the organic light-emitting device.

DETAILED DESCRIPTION

Figure 1:
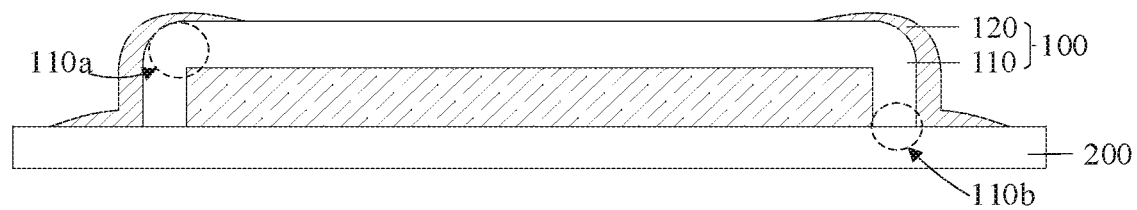
FIG. 1 is a structural diagram of an encapsulation film according to an embodiment of the present invention.

In the present invention, the auxiliary encapsulation layer is disposed on the outer side of the inorganic layer, and the auxiliary encapsulation layer at least covers a bending region of the inorganic layer and a boundary region of the inorganic layer. Even if the inorganic layer cracks or peels in the bending region and the boundary region, the channel of water and oxygen generated at the cracked place or the peeling place is blocked by the auxiliary encapsulation layer, thereby ensuring the ability of the encapsulation film to block water and oxygen into the organic light-emitting device.

Embodiments of the present invention are described detailly below. Examples of the embodiments are shown in the drawings, and units of the same or similar functions are using the same or similar numeral to represent. Embodiments reference to the appended drawings are used to describe and understand the present invention, not to limit the present invention.

In the description of the present invention, it is to be understood that the terms "center," "longitudinal," "lateral," "length," "width," "thickness," "up," "down," "front," "back," "left," "right," "vertical," "horizontal," "top," "bottom," "inside," "outside," and the like, indicate orientations or positional relationships, and are based on the orientations or positional relationships shown in the drawings, therefore may not be construed as limits to the present invention.

FIG. 1 is a structural diagram of an encapsulation film according to an embodiment of the present invention. Refer to FIG. 1, the encapsulation film 100 includes a main encapsulation layer 110 and an auxiliary encapsulation layer 120.

When the encapsulation film 100 covers a protruding structure such as a laminated structure or a step, the top surface of a region of the protruding structure covered by the main encapsulation layer 110 and the top surface of the other region have a height difference. The top surfaces of the two regions are not aligned. As shown in FIG. 1, it will exist a bending region 110a indicated by a cracked line in the figure due to the height difference caused by the covering of the main encapsulation layer 110. The main encapsulation layer 110 in the bending region 110a is deformed and easily to crack. In addition, a boundary region 110b of the main encapsulation layer 110 indicated by a cracked line in the figure, which is an interface between the main encapsulation layer 110 and a substrate 200 carrying the protruding structure, is easily to peel.

The auxiliary encapsulation layer 120 covers an outer surface of the main encapsulation layer 110, and it at least covers the bending region 110a and the boundary region 110b. In an embodiment, the auxiliary encapsulation layer 120 not only covers the bending region 110a and the boundary region 110b, but also extends outwardly and conforms to a part of the substrate 200 to achieve coverage of a larger area.

The auxiliary encapsulation layer 120 is disposed on the bending region 110a and the boundary region 110b of the main encapsulation layer 110 which are most likely to crack or peel in encapsulation film 100. Even if the main encapsulation layer 110 cracks or peels in these two regions, the auxiliary encapsulation layer 120 blocks the channel of water and oxygen generated at the cracked place or the peeling place. In this way, it is ensured that the encapsulation film 100 still has a strong ability of an encapsulation device to block water and oxygen, which is beneficial to ensure the normal use of the encapsulation device.

In detail, material of the main encapsulation layer 110 can be an inorganic material selected from the group consisting of silicon nitride, silicon oxynitride, silicon oxide, and aluminum oxide. The existence of the bending region 110a allows the main encapsulation layer 110 to cover the device it protects, and the covered device can have an uneven surface such as a protruded platform structure. In this case, the bending region 110a covers a portion having a flat surface of the protected device, and the bending region 110a covers the protruded platform structure, thereby realizing the protected device has an adaptive fit and coverage protected by the main encapsulation layer 110.

The auxiliary encapsulation layer 120 can be made of a material having a high step coverage and a good density of film formation such as inorganic material including but not limited to one or more of aluminum oxide, zirconium oxide, and titanium oxide. In an embodiment, the auxiliary encapsulation layer 120 is made of aluminum oxide, and the auxiliary encapsulation layer 120 can be formed by an atomic layer deposition (ALD) process. According to the film forming characteristics of various materials, the specific embodiment can also adopt any physical film forming process such as physical vapor deposition (PVD), pulsed laser deposition (PLD), and magnetron sputtering to produce the auxiliary encapsulation layer 120. A thickness of the auxiliary encapsulation layer 120 can be smaller than a thickness of the main encapsulation layer 110, and a step coverage of the main package layer 110 can be smaller than a step coverage of the auxiliary encapsulation layer 120.

The step coverage is the cover effect of the encapsulation layer on the structure with a height difference. For example, for the above structure having a height difference, the encapsulation layer covers a upper portion and a lower portion, and the encapsulation layer (for example, the main encapsulation layer 110) generates a bending region at an interface between the upper portion and the lower portion. If there does not happens fracture in the bending region and does not forms a complete coverage, the step coverage of the encapsulation layer and material constituting the encapsulation layer is considered to be low; if there is no fracture, the step coverage of the encapsulation layer and material constituting the encapsulation layer is considered to be high.

The auxiliary encapsulation layer 120 can cover one side of the main encapsulation layer 110 and is not limited to the outer surface shown in FIG. 1. The present invention can cover the auxiliary encapsulation layer 120 on an inner surface or both side surfaces of the main encapsulation layer 110 according to actual applications or requirements.

Depending on different features of the main encapsulation layer 110 and the auxiliary encapsulation layer 120 of the encapsulation film 100, it can form different features of encapsulated surfaces. The main encapsulation layer 110 covers entire coverage region, and the auxiliary encapsulation layer 120 reinforces or fetches up those regions with poor coverage (the bending region 110a which is easily to crack, and the boundary region 110b which is easily to peel). When the main encapsulation layer 110 cracks and peel, the auxiliary encapsulation layer 120 let the encapsulation film 100 keep a complete film layer to block water molecules and oxygen molecules. Even if the main encapsulation layer 110 does not crack and peel, the auxiliary encapsulation layer 120 can reinforce regions on the main encapsulation layer 110 that could crack or peel, and provide a higher ability of film layer to block water and oxygen on the protected device side. For example, for the auxiliary encapsulation layer 120 made of aluminum oxide, the ability to block water and oxygen may be between $10^{-4}$-$10^{-6}$ g/cm$^2$/day, and the ability to block water and oxygen is very well, and it is ideal for encapsulating the protected device.

The encapsulation film 100 above can be used in the encapsulation structure of the organic light-emitting display panel to protect components, including the organic light-emitting device. The following is an example of encapsulating an organic light-emitting device, and is described in detail with the drawings.

Figure 2:
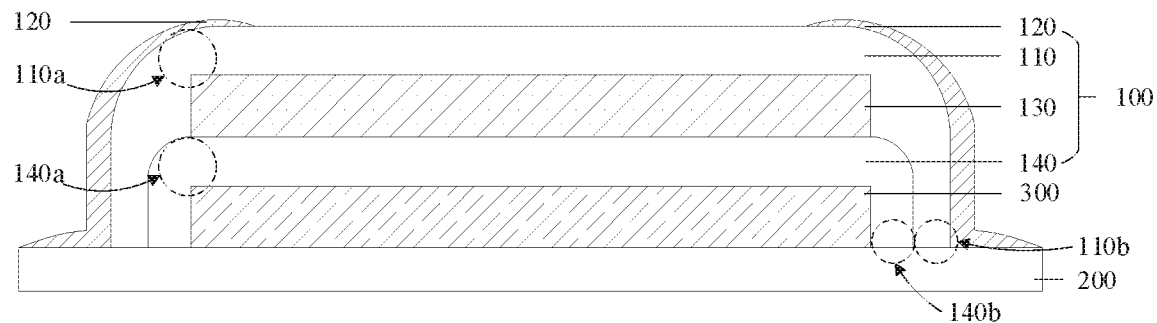
FIG. 2 is a partial sectional structural diagram of an organic light-emitting display panel according to an embodiment of the present invention.

FIG. 2 is a partial sectional structural diagram of an organic light-emitting display panel according to an embodiment of the present invention. Refer to FIG. 2, an organic light-emitting display panel includes an encapsulation film 100, a substrate 200, and an organic light-emitting device 300. The organic light-emitting device 300 is disposed on the substrate 200 and located in a pixel region defined by a pixel define layer. The encapsulation film 100 encapsulates the organic light-emitting device 300 on the substrate 200.

The substrate 200 is a substrate of the organic light-emitting display panel for carrying various structural layers and electronic components of the organic light-emitting display panel. In order to adapt to a bendable feature of the organic light-emitting display panel, the substrate 200 can be a flexible board having the bendable feature, and its main compositions include but not limited to a polyimide (PI). Optionally, the substrate 200 can be covered with a buffer layer having a function of blocking water and oxygen, and main compositions thereof include but not limited to silicon nitride, silicon oxide, silicon oxynitride. In addition, the substrate 200 can be provided with various switching devices such as thin-film transistor (TFT) for realizing a screen display of the organic light-emitting display panel.

The organic light-emitting device 300 can include a control circuit layer (also called array circuit layer), an anode, a hole transport layer (HTL), an organic light-emitting layer, an electron transport layer (ETL), and a cathode sequentially disposed on the substrate 200.

The encapsulation film 100 includes a second inorganic layer 110 (the aforementioned main encapsulation layer 110), an auxiliary encapsulation layer 120, an organic layer 130, and a first inorganic layer 140.

The first inorganic layer 140 covers the cathode of the organic light-emitting device 300 and the pixel define layer, and the first inorganic layer 140 further extends to a side of the organic light-emitting device 300 to encapsulate the organic light-emitting device 300 on the substrate 200.

The organic layer 130, which can be made by an ink-jet printing (IJP) process, is disposed on the first inorganic layer 140.

The second inorganic layer 110 covers the organic layer 130 and further extends to a side of the organic layer 130 to cover the first inorganic layer 140 and a portion of the substrate 200. The second inorganic layer 110, which has a function of blocking water and oxygen, can be made of an inorganic material. Optionally, material and manufacturing process of the second inorganic layer 110 and the first inorganic layer 140 can be the same, for example, they all can be made by a chemical vapor deposition (CVD) process.

The organic light-emitting device 300 and the substrate 200 have a height difference, and a step coverage of the first inorganic layer 140 is poor due to a material property of an inorganic material such as silicon nitride, silicon oxide, silicon oxynitride. A thickness of the first inorganic layer 140 is between 0.5-1.5 µm so that the first inorganic layer 140 has a large probability to crack at the bending region 140a when it is formed on the organic light-emitting device 300, and has a large probability to peel at the boundary region 140b contacted the substrate 200. Similarly, the second inorganic layer 110 has a large probability to crack at the bending region 110a, and has a large probability to peel at the boundary region 110b contacted the substrate 200.

The auxiliary encapsulation layer 120 is disposed on an outer surface of the second inorganic layer 110, and it at least covers the bending region 110a and the boundary region 110b. Optionally, refer to FIG. 3, the auxiliary encapsulation layer 120 surrounds the organic light-emitting device 300.

Figure 3:
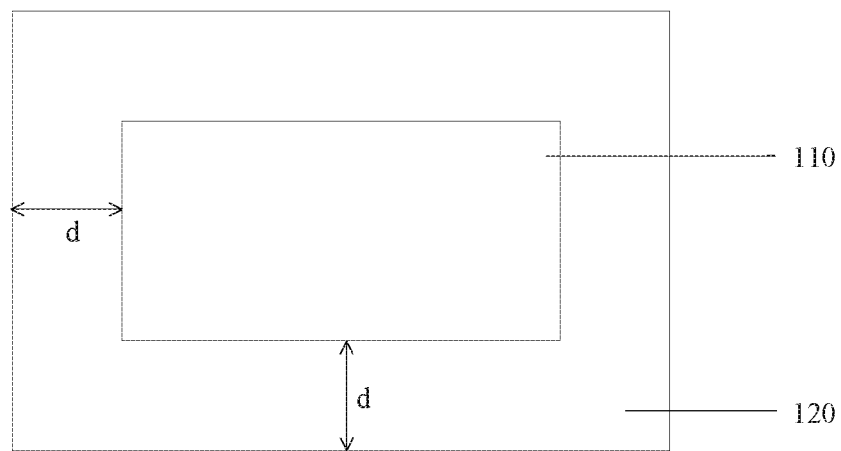
FIG. 3 is a top view structural diagram of an auxiliary encapsulation layer according to an embodiment of the present invention.

A thickness of the auxiliary encapsulation layer 120 is between 50-100 nm, and refer to FIG. 3, a width can between 100-200 µm. It can be made of a material having a high step coverage and a good density of film formation such as inorganic material including but not limited to one or more of aluminum oxide, zirconium oxide, and titanium oxide. In a specific embodiment, the auxiliary encapsulation layer 120 can be formed by an atomic layer deposition process.

Refer to FIGS. 2 and 3, first, an atomic layer deposition process forms an entire surface inorganic layer covering an organic layer 130. The entire surface inorganic layer not only covers a bending region 110a and a boundary region 110b, but also covers top of an organic light-emitting device 300. Second, coating a layer of photoresist on the entire surface inorganic layer, and the photoresist completely covers the entire surface inorganic layer. Third, exposing the layer of photoresist with a mask. A light-transmitting region of the mask corresponds to directly above the organic light-emitting device 300, thereby exposing the photoresist directly above the organic light-emitting device 300. An exposed portion of the photoresist can be removed by development, at the same time, the inorganic layer directly above the organic light-emitting device 300 is exposed, and an unexposed portion of the photoresist still covers the entire surface of the inorganic layer. Fourth, etching the exposed portion of the inorganic layer to remove the inorganic layer of the exposed portion. Last, ashing and removing a remaining photoresist, and a remaining inorganic layer can be used to obtain the auxiliary encapsulation layer 120.

Of course, depending on the feature of material used in an actual implementation, the auxiliary encapsulation layer 120 can also be formed by any film forming process such as physical vapor deposition, pulsed laser deposition, magnetron sputtering. A thickness of the auxiliary encapsulation layer 120 can be less than a thickness of the main encapsulation layer 110, and a step coverage of the second inorganic layer 110 can be less than a step coverage of the auxiliary encapsulation layer 120.

Depending on different features of the second inorganic layer 110 and the auxiliary encapsulation layer 120, it can form different features of encapsulated surfaces on the organic light-emitting device 300. The second inorganic layer 110 covers entire coverage region, and the auxiliary encapsulation layer 120 reinforces or fetches up those regions with poor coverage (the bending region 110a which is easily to crack and the boundary region 110b which is easily to peel). When the second inorganic layer 110 cracks and peels, the auxiliary encapsulation layer 120 let the encapsulation film 100 keep a complete film layer to block water molecules and oxygen molecules. Even if the second inorganic layer 110 does not crack and peel, the auxiliary encapsulation layer 120 can reinforce regions on the second inorganic layer 110 that could crack or peel, and provide a higher ability of film layer to block water and oxygen on a side of the organic light-emitting device 300.

Base on a feature of the auxiliary encapsulation layer 120, it can also cover the auxiliary encapsulation layer 120 on an outer surface of the first inorganic layer 140. When the auxiliary encapsulation layer 120 covers the bending region 140a and the boundary region 140b of the first inorganic layer 140, the auxiliary encapsulation layer 120 can reinforce regions on the first inorganic layer 140 that could crack or peel. A channel of water and oxygen of the first inorganic layer 140 at the crack is blocked by the auxiliary encapsulation layer 120, thereby further ensuring the ability to block water and oxygen into the organic light-emitting device 300.

The auxiliary encapsulation layer 120 can be made of a transparent material, and it can further cover directly above the organic light-emitting device 300.

Keep referring to FIG. 2, in a specific embodiment, at least one of the first inorganic layer 140, the organic layer 130, the second inorganic layer 110, and the auxiliary encapsulation layer 120 can be doped with a water absorbing material. The water absorbing material can absorb water molecules which are intrude into the first inorganic layer 140, the organic layer 130, the second inorganic layer 110, and the auxiliary encapsulation layer 120. The water absorbing material provides a protection for the water molecules, increases the difficulty for the water molecules to reach the organic light-emitting device 300, and further improves the ability to block the water molecules.

Material of the water absorbing material include but not limited to calcium oxide having a size scale at the nanometer level, which is nano-sized calcium oxide particles. A concentration of the water absorbing material sequentially increases along a direction from the organic light-emitting device 300 to a bending region 110a and a boundary region 110b of the second inorganic layer 110. The closer to the region where could crack and peel, the higher the doping concentration of the water absorbing material.

Figure 4:
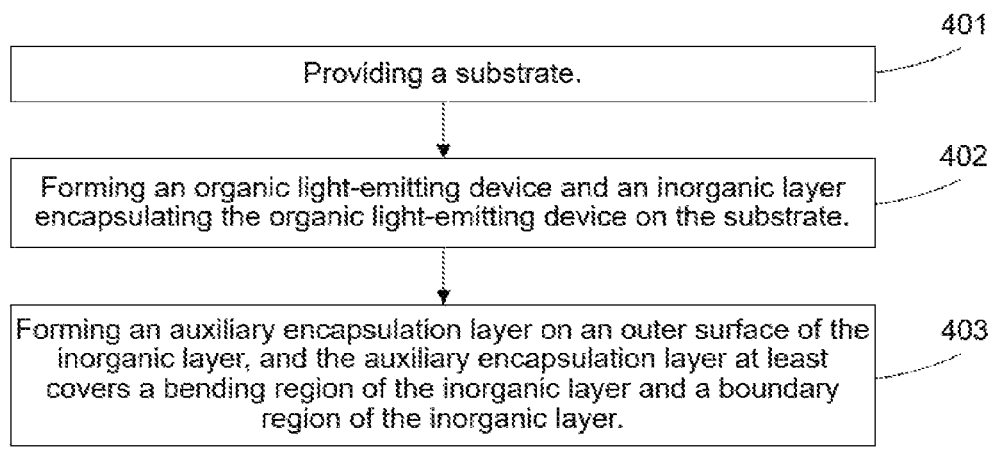
FIG. 4 is a flowchart of a manufacturing method of the organic light-emitting display panel according to one embodiment of the present invention.

FIG. 4 is a flowchart of a manufacturing method of the organic light-emitting display panel according to one embodiment of the present invention. A manufacturing method of an organic light-emitting display panel includes the steps of:

S401: Providing a substrate.

S402: Forming an organic light-emitting device and an inorganic layer encapsulating the organic light-emitting device on the substrate.

S403: Forming an auxiliary encapsulation layer on an outer surface of the inorganic layer, and the auxiliary encapsulation layer at least covers a bending region of the inorganic layer and a boundary region of the inorganic layer.

The manufacturing method of the organic light-emitting display panel disposes the auxiliary encapsulation layer on the outer surface of the inorganic layer, and the auxiliary encapsulation layer at least covers a bending region of the inorganic layer and a boundary region of the inorganic layer. Even if the inorganic layer cracks or peels in the bending region and the boundary region, the channel of water and oxygen generated at the cracked place or the peeling place is blocked by the auxiliary encapsulation layer, thereby ensuring the ability of the encapsulation film to block water and oxygen into the organic light-emitting device.

Figure 5:
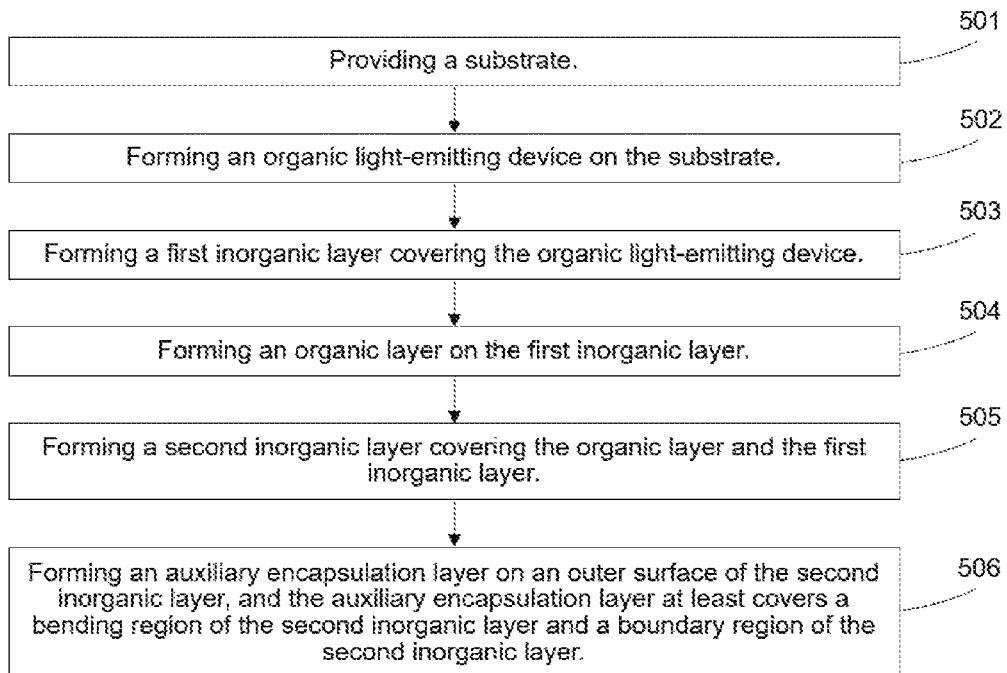
FIG. 5 is a flowchart of the manufacturing method of the organic light-emitting display panel according to the other embodiment of the present invention.

Further, the manufacturing method of the organic light-emitting display panel for a case that the auxiliary encapsulation layer is formed on an outer surface of a second inorganic layer of the organic light-emitting display panel, please refer to FIG. 5. The manufacturing method of the organic light-emitting display panel includes the steps of:

S501: Providing a substrate.

S502: Forming an organic light-emitting device on the substrate.

S503: Forming a first inorganic layer covering the organic light-emitting device.

S504: Forming an organic layer on the first inorganic layer.

S505: Forming a second inorganic layer covering the organic layer and the first inorganic layer.

S506: Forming an auxiliary encapsulation layer on an outer surface of the second inorganic layer, and the auxiliary encapsulation layer at least covers a bending region of the second inorganic layer and a boundary region of the second inorganic layer.

Although the present invention is shown and described by using one or more implementation manners, a person skilled in the art may conceive equivalent variations and modifications based on reading and understanding of the specification and the accompany drawings. The present invention includes all such variations and modifications, which is only limited by the scope of the appended claims. In particular regard to the various functions performed by the foregoing components (such as elements and resources), terms used to describe such components are intended to correspond to any component (unless indicated otherwise) performing specified functions of the components (for example, the components are equivalent in functions), even though structures of the functions are not equivalent to the disclosed structures of functions in the exemplary implementation manners in the specification shown in the specification. In addition, although specific features of the specification are disclosed with respect to only one of several implementation manners, the features may be combined with one or more other features of other implementation manners that are desirable for and advantageous to a given or specific application. Moreover, for the terms "include", "have", "contain" or variations thereof being used in specific implementation manners or claims, the terms are intended to be inclusive in a similar manner to that of the term "comprise". The specification provides various operations of the embodiments. The sequence of some or all operations described should not be explained as that the operations must be related to the sequence. A person skilled in the art will understand replaceable sequences having benefits of the specification. Moreover, it should be understood that, not all operations are mandatory in every embodiment provided in the specification.

The present invention has been disclosed through preferred embodiments; however, the preferred embodiments are not intended to limit the present invention, and a person of ordinary skill in the art can make various modifications and improvements without departing from the spirit and scope of the present invention; therefore, the protection scope of the present invention should be subject to the scope defined by the claims.

What is claimed is:

1. An organic light-emitting display panel, comprising:
   an organic light-emitting device;
   an inorganic layer comprising a first inorganic layer and a second inorganic layer and encapsulating the organic light-emitting device;
   an auxiliary encapsulation layer encapsulating the organic light-emitting device; and
   an organic layer;
   wherein the auxiliary encapsulation layer at least covers a bending region of the inorganic layer and a boundary region of the inorganic layer;
   wherein the first inorganic layer, the organic layer, and the second inorganic layer are sequentially laminated, and the auxiliary encapsulation layer surrounds the organic light-emitting device and covers an outer surface of the second inorganic layer;
   wherein the at least one of the first inorganic layer, the organic layer, the second inorganic layer, and the auxiliary encapsulation layer is doped with a water absorbing material; and
   wherein a concentration of the water absorbing material sequentially increases along a direction from the organic light-emitting device to a bending region of the second inorganic layer and a boundary region of the second inorganic layer.

2. The organic light-emitting display panel as claimed in claim 1, wherein composition of material of the auxiliary encapsulation layer is selected from the group consisting of aluminum oxide, zirconium oxide, and titanium oxide.

3. An encapsulation film, comprising:
   an inorganic layer; and
   an auxiliary encapsulation layer;
   wherein the auxiliary encapsulation layer at least covers a bending region of the inorganic layer and a boundary region of the inorganic layer;

wherein at least one of the inorganic layer and the auxiliary encapsulation layer is doped with a water absorbing material; and wherein a concentration of the water absorbing material sequentially increases along a direction from the bending region to the boundary region.

4. The encapsulation film as claimed in claim 3, wherein composition of material of the auxiliary encapsulation layer is selected from the group consisting of aluminum oxide, zirconium oxide, and titanium oxide.

5. A manufacturing method of an organic light-emitting display panel, comprising the steps of:

providing a substrate;

forming an organic light-emitting device, an organic layer, and an inorganic layer encapsulating the organic light-emitting device on the substrate, wherein the inorganic layer comprises a first inorganic layer and a second inorganic layer, and the first inorganic layer, the organic layer, and the second inorganic layer are sequentially laminated and cover the organic light-emitting device; and forming an auxiliary encapsulation layer on an outer surface of the inorganic layer, and the auxiliary encapsulation layer at least covers a bending region of the inorganic layer and a boundary region of the inorganic layer, wherein the auxiliary encapsulation layer surrounds the organic light-emitting device and covers an outer surface of the second inorganic layer;

wherein at least one of the first inorganic layer, the organic layer, the second inorganic layer, and the auxiliary encapsulation layer is doped with a water absorbing material; and wherein a concentration of the water absorbing material sequentially increases along a direction from the organic light-emitting device to a bending region of the second inorganic layer and a boundary region of the second inorganic layer.

6. The manufacturing method of the organic light-emitting display panel as claimed in claim 5, wherein composition of material of the auxiliary encapsulation layer is selected from the group consisting of aluminum oxide, zirconium oxide, and titanium oxide.

* * * * *